(12) United States Patent
Weiss

(10) Patent No.: US 7,084,412 B2
(45) Date of Patent: Aug. 1, 2006

(54) COLLECTOR UNIT WITH A REFLECTIVE ELEMENT FOR ILLUMINATION SYSTEMS WITH A WAVELENGTH OF SMALLER THAN 193 NM

(75) Inventor: Markus Weiss, Aalen (DE)

(73) Assignee: Carl Zeiss SMT AG, Oberkochen (DE)

(*) Notice: Subject to any disclaimer, the term of this patent is extended or adjusted under 35 U.S.C. 154(b) by 0 days.

(21) Appl. No.: 10/952,412

(22) Filed: Sep. 28, 2004

(65) Prior Publication Data

US 2005/0094764 A1   May 5, 2005

Related U.S. Application Data

(63) Continuation of application No. PCT/EP03/02115, filed on Mar. 1, 2003.

(30) Foreign Application Priority Data

Mar. 28, 2002  (DE)  ................................ 102 14 259

(51) Int. Cl.
*H01J 21/425*  (2006.01)

(52) U.S. Cl. ................................ 250/492.2; 250/461.1; 378/34

(58) Field of Classification Search .............. 250/492.2
See application file for complete search history.

(56) References Cited

U.S. PATENT DOCUMENTS

| | | |
|---|---|---|
| 1,865,441 A | 7/1932 | Mutscheller |
| 5,016,265 A | 5/1991 | Hoover .................. 378/43 |
| 5,745,547 A | 4/1998 | Xiao ...................... 378/145 |
| 5,763,930 A | 6/1998 | Partlo ..................... 250/504 |
| 5,768,339 A | 6/1998 | O'Hara .................. 378/147 |
| 6,064,072 A | 5/2000 | Partlo et al. ........... 250/504 |
| 6,118,577 A | 9/2000 | Sweatt et al. .......... 359/351 |
| 6,198,793 B1 | 3/2001 | Schultz et al. ......... 378/34 |
| 6,244,717 B1 | 6/2001 | Dinger ................... 359/859 |

FOREIGN PATENT DOCUMENTS

| | | |
|---|---|---|
| DE | 30 01 059 C2 | 4/1983 |
| EP | 1225481 A2 | 7/2002 |
| WO | WO 99/27542 | 6/1999 |
| WO | WO 00/63922 | 10/2000 |
| WO | WO 01/08162 A1 | 2/2001 |
| WO | WO 01/09681 A2 | 2/2001 |
| WO | WO 02/12928 A2 | 2/2002 |
| WO | WO 02/099534 A2 | 12/2002 |

OTHER PUBLICATIONS

Étude Preéliminaire D'Objectifs Catadioptriques A Rayons X Utilisant La Réflexion Totale Ou Les Multicouches Pour Le Diagnostic Des Plasmas, Horizons de l'Optique 83, J. Optics (Paris),1984, vol. 15, n° 4 bis, pp. 270-280.

Handbook on Synchrotron Radiation, vol. 2, Chapter 4 "Diffraction Grating Optics", edited by G.V. Marr, Elsevier Science, pp. 56-84.

Wolter, "Annalen der Physik" (Annals of Physics) 10, 94-114, 1952.

*Primary Examiner*—John R. Lee
*Assistant Examiner*—Phillip A. Johnston
(74) *Attorney, Agent, or Firm*—Ohlandt, Greeley, Ruggiero & Perle, L.L.P.

(57) ABSTRACT

There is provided a collector unit for illumination systems with a wavelength of $\leq 193$ nm, preferably $\leq 126$ nm, and especially preferably in the region of EUV wavelengths. Rays of a beam bundle impinge on the collector unit, and the beam bundle emerges from an object in an object plane. The collector unit includes at least one mirror shell that receives the rays of the beam bundle emerging from the object and shows an optical effect, and a periodic structure with at least one grating period applied to at least a part of the mirror shell. An illumination system and an EUV projection exposure system are also provided.

19 Claims, 7 Drawing Sheets

COLLECTOR UNIT WITH A REFLECTIVE ELEMENT FOR ILLUMINATION SYSTEMS WITH A WAVELENGTH OF SMALLER THAN 193 NM

CROSS-REFERENCE TO RELATED APPLICATIONS

The present application is a continuation of International Patent Application No. PCT/EP03/02115, filed Mar. 1, 2003, which claims priority of German Patent Application No. 102 14 259.9, filed Mar. 28, 2002.

BACKGROUND OF THE INVENTION

1. Field of the Invention

The invention relates to a collector unit for illumination systems with a wavelength of $\leq 193$ nm, preferably $\leq 126$ nm, especially preferably with wavelengths in the EUV region with at least one mirror shell which receives the rays of a beam bundle coming from an object and has an optical effect with regarding the rays of the beam bundle.

Preferably, the rays of the beam bundle impinges under an angle of <20° to the surface tangent of the mirror shell.

Moreover, the invention also provides an illumination system with such a collector, a projection exposure system with an illumination system in accordance with the invention as well as a method for exposing microstructure.

2. Description of the Related Art

Nested collectors for wavelengths $\leq 193$ nm, especially wavelengths in the region of X-rays, are known from a large number of publications.

U.S. Pat. No. 5,768,339 discloses a collimator for X-rays, with the collimator having several nested paraboloidal reflectors. The collimator according to U.S. Pat. No. 5,768,339 is used for the purpose of shaping an isotropically radiated ray beam of an X-ray light source into a parallel beam.

U.S. Pat. No. 1,865,441 discloses a nested collector for X-ray beams. The nested collector in the case of U.S. Pat. No. 5,768,339 is used for collimating isotropic X-rays emitted from a source into a parallel ray beam.

U.S. Pat. No. 5,763,930 shows a nested collector for a pinch plasma light source which is used to collect the rays emitted by a light source and to focus the same in a waveguide.

U.S. Pat. No. 5,745,547 shows several arrangements of multi-channel optics which are used to focus the radiation of a source, especially X-rays, by multiple reflections.

In order to achieve an especially high transmission efficiency, the invention pursuant to U.S. Pat. No. 5,745,547 proposes elliptically shaped reflectors.

DE 30 01 059 C2 discloses an arrangement for use in X-ray lithography systems which comprises nested parabolic mirrors. The nested parabolic mirrors are arranged between X-ray source and mask. These mirrors are arranged in such a way that a diverging X-ray beam bundle impinging onto the nested collector is shaped into an X-ray beam bundle emerging from the nested collector in parallel.

The arrangement according to DE 30 01 059 is merely used for achieving a favourable collimation for X-ray lithography.

The arrangement of nested reflectors as known from WO 99/27542 is used in an X-ray proximity lithography system to refocus light of a light source, so that a virtual light source is formed. The nested shells can have an ellipsoid shape.

A nested reflector for high-energy photon sources is known from U.S. Pat. No. 6,064,072 which is used for forming the diverging X-rays into a ray beam extending in parallel.

WO 00/63922 shows a nested collector which is used for collimating a neutron beam.

WO 01/08162 discloses a nested collector for X-rays which is characterized by a surface roughness of the inner, reflective surfaces of the individual mirror shells of less than 12 Å. The collectors as shown in WO 01/08162 also comprise systems with multiple reflections, especially also Wolter systems, and are characterized by a high resolution as is required for X-ray lithography for example. A further problem in illumination systems for wavelengths $\leq 100$ nm in addition to the collection of the radiation emitted by the light source is that the light sources of such illumination systems also emit radiation of a wavelength which may lead to an undesirable exposure of the light-sensitive object in the wafer plane of the projection exposure system and optical components of the exposure system such as multilayer mirrors are heated in an impermissible way by such radiation and will rapidly degrade. Transmission filters made of zirconium can be used for filtering out such undesirable radiation. Such filters furthermore have the disadvantage of high losses of light. Moreover, they can be destroyed very easily by thermal loads. A further problem of illumination optics for EUV lithography is that the losses of light will grow strongly with the number of optical components.

SUMMARY OF THE INVENTION

It is thus the object of the present invention to provide a collector unit for an illumination system for microlithography with wavelengths of $\leq 193$ nm, preferably $\leq 126$ nm, especially preferably for wavelengths in the EUV range, which collector meets the requirements placed on uniformity and telecentricity required for illumination optics on the one hand and allows a spectral filtering towards the useful wavelength on the other hand. It is to prevent in particular that radiation of wavelengths other than the used wavelength will reach the illumination system. Moreover, the component is to be compact and minimize the losses of light when used in an EUV illumination system.

This object is achieved in accordance with the invention by a collector unit with at least one mirror shell. The mirror shell has a periodic structure with at least one grating period applied to a part of the mirror shell. The beam bundle impinging upon the mirror shell is diffracted by applying a periodic structure on the mirror shell. The focal points of the different diffraction orders are situated in different planes. If a diaphragm is arranged in a plane in which a diffraction order is focused, then the other diffraction orders which are deflected into other solid angle elements cannot pass through the diaphragm and can thus not reach the subsequent illumination system. In this way it is possible to reach a separation of the used radiation which is at 13.5 nm for example and the radiation of other wavelengths, especially wavelengths $\geq 100$ nm which can be found in the $0^{th}$ diffraction order. It is further possible, through such an arrangement, to prevent the penetration of particles emerging from the light source into a subsequent illumination system.

A further advantage of the collector in accordance with the invention is that the effective exit space of the diffracted beam bundle is longer than in a system in which the nested collector and the plane grating form two separate components. This offers several advantages. On the one hand, a lower bandwidth can be achieved with the same dispersion as in a system with nested collector and separated planar grating element. On the other hand, the separation of the different diffraction orders is higher than in a system with a nested collector and separated planar grating element. When used in an illumination system, the distance in the light path from the light source to the collector can be reduced at a comparable line density with respect to a planar grating element and an illumination system can thus be configured in a very compact way. By combining the collecting properties of a collector with the filtering properties of a spectral filter in the component in accordance with the invention it is possible to omit one optical element in the illumination system, thus enabling an increase in the transmission of the illumination system by approximately 30%.

In order to achieve especially high diffraction efficiencies, in an advantageous embodiment the grating is configured as a blaze grating with a blaze angle $\epsilon$.

It is especially preferable if the collector unit comprises a plurality of mirror shells which are arranged in a rotationally symmetrical fashion relative to a rotational axis. Each mirror shell is then associated with a ring aperture element of the aperture on the object side.

Collectors arranged in a rotationally symmetrical way offer further advantages. In the case of a collector which is rotationally symmetrical relative to a rotational axis, the uniformity of the illumination in a plane and the shape of the pupil to be illuminated can be controlled better than in an illumination system with a planar grating element for example. Moreover, such rotationally symmetrical components in an illumination system offer advantages in the alignment of the individual components relative to each other. A further advantage is the symmetrical behaviour, for example during heating.

The region which is illuminated by the collector unit is situated in a plane for example and consists of ring elements, with each ring element preferably being associated with a ring aperture element. The ring aperture elements and the associated ring elements do not overlap in an advantageous embodiment and the ring elements are substantially continuously adjacent to each other in the plane.

A substantially uniform illumination in a plane can be achieved with the nested collector unit in accordance with the invention. As a result of the combination of the optical (e.g. collecting) effect of the collector for the radiation emitted by the light source and the filtering for the used wavelength in a single component according to the invention, the transmission in illumination systems can be increased and the overall size of the illumination system can be reduced to a substantial extent.

The mirror shells can preferably be an annular segment of an ellipsoid, a paraboloid or a hyperboloid. A completely parallel beam bundle is obtained for a paraboloid and thus a light source situated in infinity.

If the shells are sections of ellipsoids, a converging beam bundle is formed. Collectors with shells which are sections of hyperboloids lead to a diverging beam bundle.

In order to obtain a substantially homogeneous illumination or uniform illumination it is advantageous when the collector is provided with the largest possible number of shells. Preferably, the collector in accordance with the invention comprises more than four, more preferably more than seven and especially preferably more than ten reflectors in a shell-like arrangement. A further advantage is that the divergence of the partial beam bundles of the respective mirror shell as diffracted in the diaphragm plane is reduced with the increasing number of mirror shells and thus a better separation of the different diffraction orders in the diaphragm plane is achieved.

It is preferable when the plurality of the mirror shells arranged about a common rotational axis is configured in such a way that multiple reflections occur in a mirror shell. As a result of multiple reflections in a shell it is possible to keep the reflection angles low. Particularly systems with an even number of reflections are insensitive to maladjustments, especially tilting relative to the optical axis. The optical axis in the case of rotationally symmetrical systems is the rotational axis.

The reflectivity acts nearly linear with the incidence angle relative to the surface tangent in the case of reflection under grazing incidence with small incidence angles of less than 20° relative to the surface tangent in the case of materials such as ruthenium, rhodium, palladium, silver, carbon or gold, so that reflection losses for a reflection under 16° for example or two reflections under 8° are approximately the same. It is advantageous to use more than one reflection for the maximum achievable aperture of the collector.

Systems with two reflections are especially preferable. Collectors with two reflections can be configured as Wolter systems for example with a first segment of a mirror shell which is an annular section of a hyperboloid and a second segment of a mirror shell which is an annular section of an ellipsoid.

Wolter systems are known from literature, e.g. from Wolter, "Annalen der Physik" (Annals of Physics) 10, 94–114, 1952. Reference is hereby made to J. Optics, Vol. 15, 270–280, 1984, concerning Wolter systems with a real intersection width, i.e. a real intermediate image of the source which is formed by the combination of a hyperboloidal surface with an ellipsoidal surface.

A special advantage of Wolter systems is that in a Wolter system with two reflections with incidence angles of less than 20° relative to the surface tangent it is possible to choose a collection aperature of $NA_{max}$~0.985 according to an aperture angle of 80°, whereby one is still situated in the highly reflective region of the reflection under grazing incidence with a reflectivity >70%.

It is provided for in a preferred embodiment of the invention that the periodic grating is applied to the second segment of a shell of a Wolter system.

In such a case the first segment is preferably a section of a hyperboloid with a virtual focus. The second segment is configured in such a way that it has a focusing effect. This can be achieved in such a way that in the case of a linear grating with constant line density the surface of the second segment is curved in a concave fashion in the meridian section. A meridian section shall be understood in the present application as being a section which comprises the optical axis. The focusing effect of the second segment can also be achieved by a variation of the line density. In such a case the surface in the meridian section can be plane or also convex. In the case of a plane surface in the meridian section, the second segment which is rotationally symmetrical about the optical axis then has the shape of a truncated cone.

Alternatively, the grating can also be applied to the first segment or both segments. Gratings on both segments are preferable if a high spectral purity is desirable. A grating on the first segment is provided when it is to be prevented for example that the $0^{th}$ order emerges from the collectors, but instead is absorbed on the rear side of the adjacent mirror shell. A diaphragm for blocking the light of the unused order can then be omitted.

The periodic structure on the second segment which is preferably a blaze grating with a blaze depth B or a blaze angle ε can either be introduced into the core for the galvano-plastic shaping of the individual mirror shells by diamond turning or alternatively by notching the grating into a coating applied to the mirror shell, e.g. a gold coating.

If the collector unit is configured in such a way that unused diffraction orders emerge from the unit, then this leads to the advantage as compared with planar grating elements that the light intensity of the emerging diffraction orders is distributed to one ring element. The thermal load on a diaphragm element can be reduced considerably as compared with conventional planar grating elements.

In addition to the collector unit, the invention also provides an illumination system with such a collector unit. The illumination system is preferably a double-facetted illumination system with a first optical element with first raster elements and a second optical element with second raster elements as shown in U.S. Pat. No. 6,198,793 B1, the scope of disclosure of which shall fully be included in the present application.

The first and/or second raster elements can be planar facets or facets with a collecting or dispersing effect.

The illumination system comprising the collector in accordance with the invention is preferably used in a projection exposure system for microlithography, with such a projection exposure system being shown in PCT/EP 00/07258, the scope of which is hereby fully included in the present application. Projection exposure systems comprise a projection objective downstream of the illumination device, e.g. a four-mirror projection objective as shown in U.S. Pat. No. 6,244,717 B1, the scope of disclosure of which is hereby fully included in the present application.

BRIEF DESCRIPTION OF THE DRAWINGS

The invention is now explained in closer detail by way of examples by reference to the enclosed drawings, wherein.

DESCRIPTION OF THE INVENTION

Figure 1:
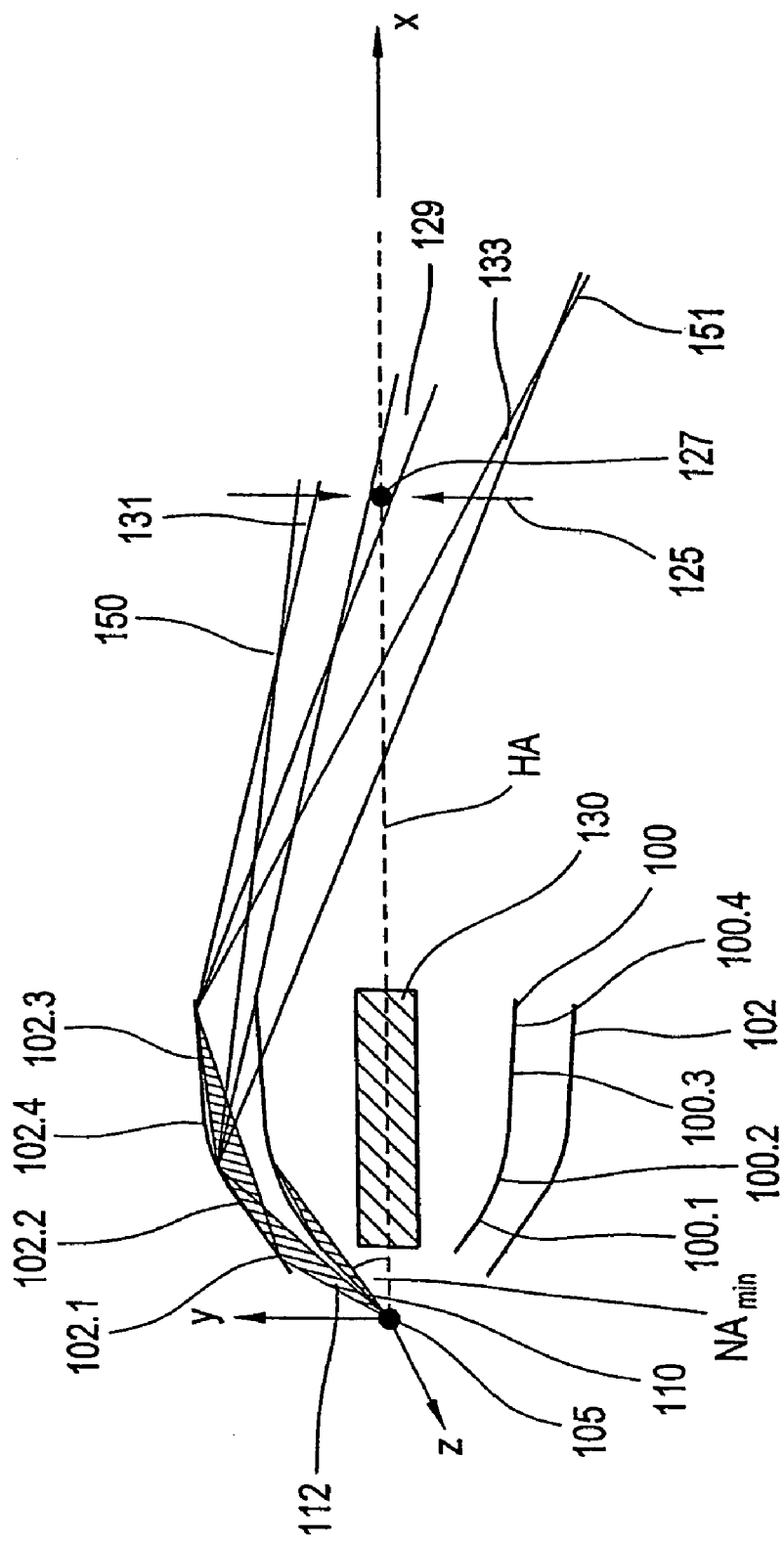
FIG. 1 shows a schematic diagram of a collector with a grating which is applied to the second mirror shell.

In FIG. 1, two shells are shown in a meridian section of a nested collector in accordance with the invention by way of example, with each mirror shell 100, 102 comprising a Wolter system with a first annular section 100.1, 102.1 with a first optical surface 100.2, 102.2 and a second annular segment 100.3, 102.3 with a second optical surface 100.4, 102.4. The individual shells 100, 102 are arranged in a rotationally symmetrical way about the X-axis or the optical axis HA. As can be seen from FIG. 1, the ring aperture elements 110, 112 associated to the respective mirror shells 100, 102 are substantially mutually adjacent to each other, meaning that the aperture on the object side of the collector as shown in FIG. 1 only shows a gap between the individual ring aperture elements as a result of the finite thickness of the mirror shells. The ring aperture elements of the respective mirror shell receive a partial beam bundle of the beam bundle emitted from a light source 105, e.g. a laser-plasma source. By suitably choosing the parameters of the periodic structure or grating applied to the second segment 100.3, 102.3 it is possible, as explained below, that for all shells, independent of the received ring aperture element and the shell, the partial beam bundles of different shells are diffracted into a specific diffraction order (which is +1$^{st}$ diffraction order 129 in this case) in one and the same focus 127 of the diaphragm plane 125.

In the embodiment as shown in FIG. 1, the first optical surface 100.2, 102.2 and the second optical surface 1004, 102.4 are directly adjacent without any gap.

It can be provided for alternatively that the first optical surface 100.2, 102.2 and the second optical surface 100.4, 102.4 are not directly adjacent. There is then a gap or unused region each between the optical surfaces. Cooling devices for cooling the mirror shells could be arranged in the unused region.

A diaphragm 130 is further shown in the collector according to FIG. 1 in the inner of the innermost mirror shell. Nested reflective collectors necessary require a central shading as a result of the finite size of the mirror shells, meaning that below a certain aperture angle $NA_{min}$ the radiation of the source cannot be received. Diaphragm 130 prevents that light travelling directly through the central shell will reach the subsequent illumination system as stray light.

FIG. 1 also shows the diffraction orders not focused in the diaphragm plane 125 for the grating on the second segment of the second mirror shell, namely the 0$^{th}$ diffraction order 131 and the +2$^{nd}$ diffraction order 133.

Figure 2:
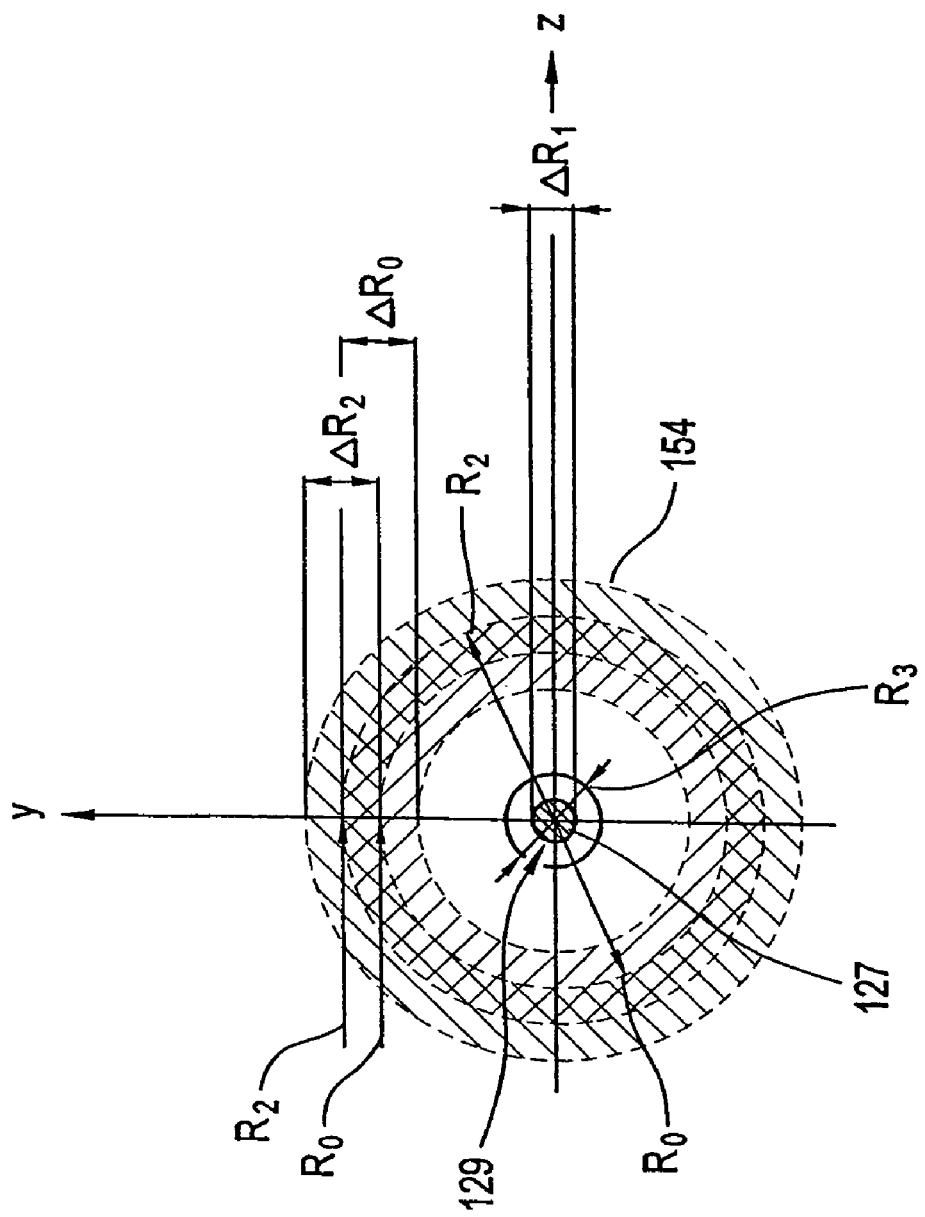
FIG. 2 shows the illumination in a diaphragm plane arranged behind the collector for a shell of the collector, with the illumination of the different diffraction orders being shown.

FIG. 2 shows the illumination with a collector in accordance with the invention for a mirror shell, which in this case is the second mirror shell 102 in the diaphragm plane 125.

Diaphragm plane 125 is defined by the Z- and Y-axis of a system of coordinates whose origin coincides with the position of the real light source 105. This system of coordinates is shown in FIG. 1.

As can be seen from FIG. 2, the +1$^{st}$ order 129 is focused in the diaphragm plane 125 which in the present case is the paper plane and comprises a diameter $\Delta R_1$. Orders other than the +1$^{st}$ order such as the +2$^{nd}$ order or the 0$^{th}$ order appear as rings in the diaphragm plane because they are defocused as a result of the converging beam path relative to the diaphragm plane. This can be seen very well in FIG. 1. The focus of the 0$^{th}$ order 150 is situated in front of the diaphragm plane 125. The focus 151 of the +2$^{nd}$ order is situated behind the diaphragm plane 125 in the X-direction. The width of the circular illumination of the 0$^{th}$ order is $\Delta R_0$ and that of the +2$^{nd}$ order is $\Delta R_2$. The mean distance of the respective diffraction order to the optical axis is $R_2$ or $R_0$.

By introducing a circular diaphragm 154 with radius $R_3$ it is possible to stop down the 0$^{th}$ and 2$^{nd}$ order in the diaphragm plane 125. In this way it is possible to completely stop down the wavelengths contained in other orders and to prevent that they enter into an illumination system situated behind the collector in accordance with the invention.

Figure 3:
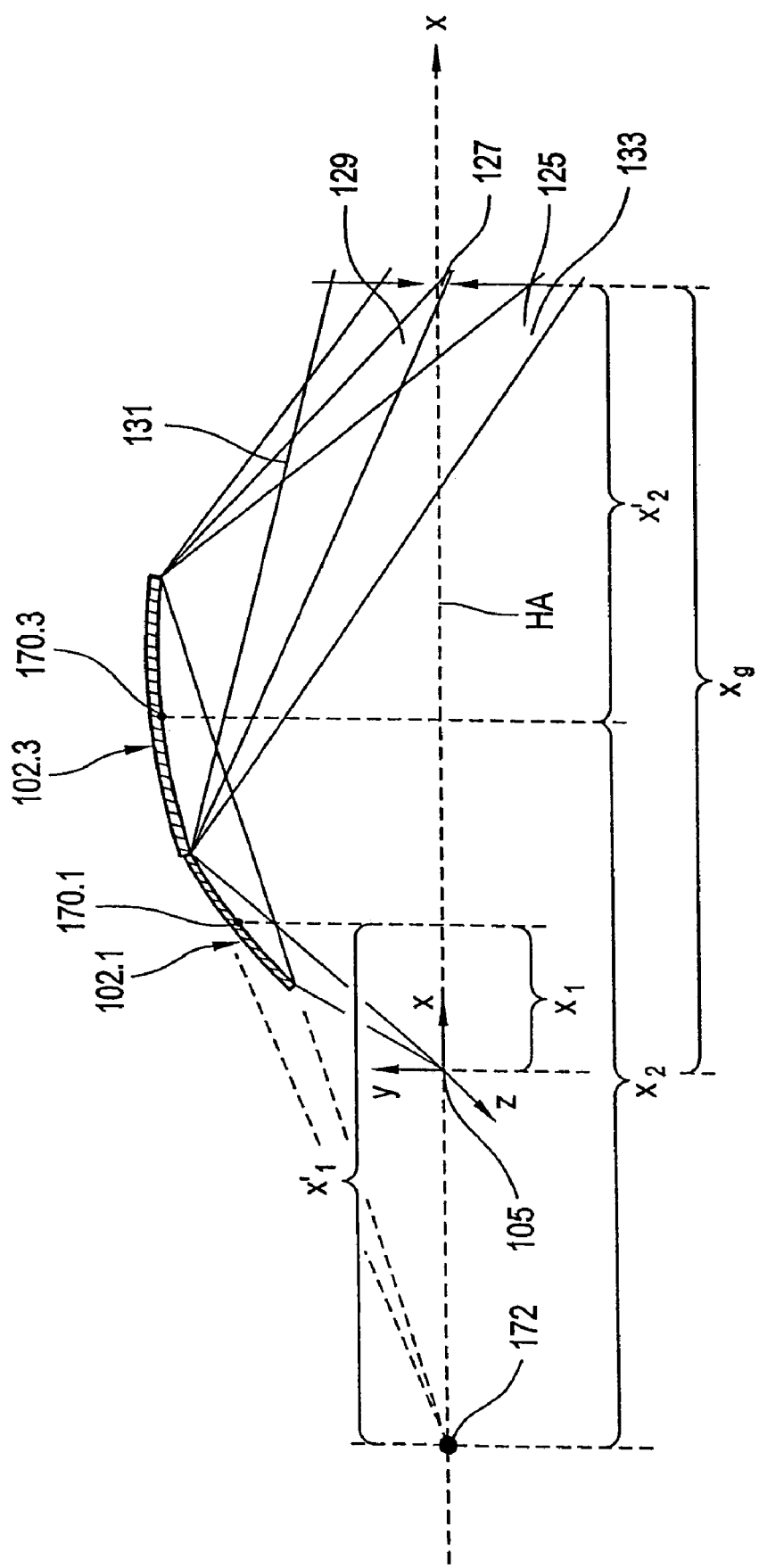
FIG. 3 shows a mirror shell with a first segment which is the annular segment of a hyperbola, and a second segment which has a circle as a surface line and on which a grating is applied in the meridian section.

FIG. 3 again shows a shell of a nested collector in accordance with the invention with two segments 102.1, 102.3. The first segment 102.1 with a first optical surface is a hyperbola surface which receives the light from the light source 105. This is also the origin of the reference coordinate system. The distance of the coordinate origin to the central point 170.1 of the first segment 102.1 in the meridian section projected onto the X-axis is designated as $x_1$. The distance from the central point 170.1 of the first segment 102.1 in the meridian section to the virtual focus 172 projected onto the X-axis is designated as $x_{1'}$. As a result of the configuration of the first segment 102.1 as a hyperbola, the same has a virtual focus 172 and projects the real light source 105 to a virtual light source. The virtual light source is then projected by the second segment 102.3 with a second optical surface to which the grating element is applied into the diaphragm plane 125 for the $+1^{st}$ diffraction order. FIG. 3 also shows the $0^{th}$ diffraction order 131 and the $+2^{nd}$ diffraction order 133. The distance from the virtual light source which is situated in the virtual focus 172 to the central point 170.3 of the second segment 102.3 in the meridian section projected onto the X-axis is designated as $x_2$. The distance from central point 170.3 of the second segment to the focus 127 of the $+1^{st}$ diffraction order projected onto the X-axis is designated in meridian section as $x_{2'}$.

An embodiment is now provided below for a nested collector with a plurality of mirror shells with two segments which are rotationally symmetrical about a common axis HA, which embodiment carries a grating structure in the region of the second reflection, i.e. on the second optical surface of the second segment. This is to ensure that broadband EUV radiation as produced by plasma sources for example is filtered. The characteristic variables of the system which form the basis for the calculation below are stated in table 1.

TABLE 1

Characteristic variables of the system:

| Central wavelength | λ | 13.5 nm |
| Distance source to diaphragm | $x_g$ | 2000 mm |
| Diameter of source | D | 2.5 mm |
| Lateral magnification | $M_g$ | 4 |

In the case of systems with two segments the projection of the source to the diaphragm occurs in two steps. The first optical reflection surface of the first segment 102.1 is configured as a hyperboloid surface in order to create a virtual focus 172 for the second optical reflection surface of the second segment 102.3. A grating structure is introduced there which spectrally splits the light. The surface of the second mirror segment 102.3 is curved in a toroidal manner, i.e. the surface line is circular and the toroidal surface comprises in the meridional plane a curvature or a radius. The grating line density and the radius of the toroidal surface must be calculated in such a way that the focus of the $+1^{st}$ diffraction order comes to lie in the diaphragm plane. All other orders as well as the $0^{th}$ diffraction order appear in the diaphragm plane as concentric rings about said focus and are stopped by the diaphragm. Advantageously, the grating will be configured as a blaze grating in order to achieve maximum diffraction efficiency. The grating line density of the grating will be chosen in such a way that the orders are sufficiently separated in order to achieve a favourable filtering function. Finally, the geometry of the grating must be chosen in such a way that the aberrations are minimal.

The formulas will be derived below from which are obtained the grating constant, the blaze angle, the radius of the toroidal surface of the second segment in meridian section and the parameters of the hyperboloid surface.

At first, the principal geometry with the principal distances is determined. Then the grating surface and the hyperboloid surface with their parameters are determined. Finally, the extensions of the surfaces are determined in such a way that there is a most complete transmission of the aperture. The spaces between source, first projection and second projection are determined as described below. The variables stated in the following derivation are shown in all FIGS. 3, 4a and 4b.

Figure 4A:
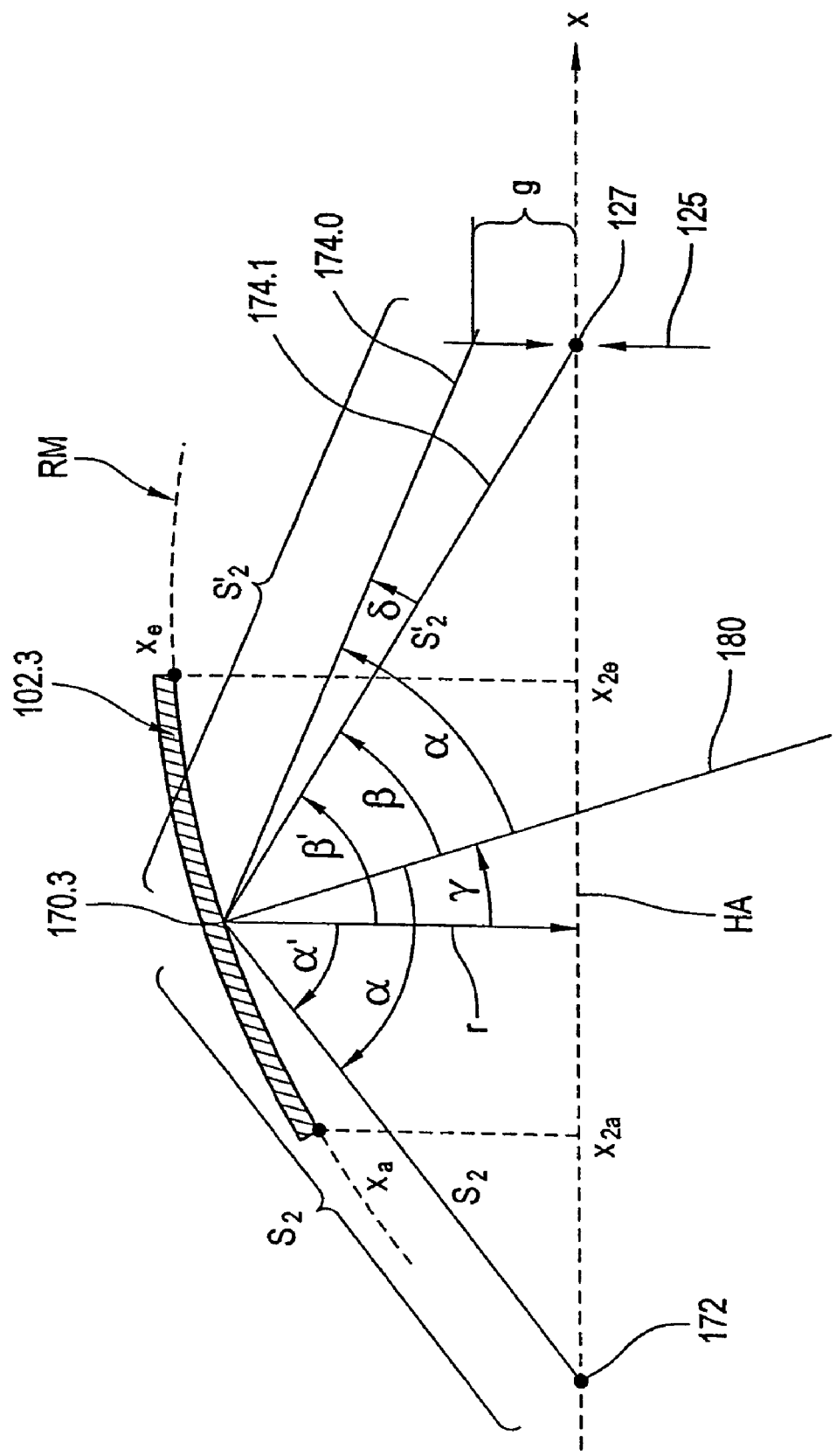
FIG. 4a shows the second segment of the shell surface as shown in FIG. 3 with applied grating and illustrated angles for deriving the line number density on the grating in the meridian section.

FIG. 3 shows a mirror shell with a first segment 102.1 and a second segment 102.3. FIG. 4a shows in more detail the second segment 102.3 of the mirror shell with the variables required for the derivation and in FIG. 4b the first segment 102.1 with the variables required for the derivation.

Based on the distance $x_1$ projected onto the X-axis between source 105 and focus 127 in the diaphragm plane 125, the projection is split into two approximately similar projection steps. This ensures that the incident angles will not become excessively large for any of the reflections.

The axial object width $x_1$ and the image width $x'_1$ is defined for the first projection step and axial object width $x_2$ and the image width $x'_2$ for the second projection step. These are the intersection widths projected onto the optical axis, as shown in FIG. 3. Thus the following applies:

$$x_g = x_1 + x'_1 + x_2 + x'_2$$

The lateral magnifications of the individual projection steps are:

$$M_1 = -\frac{x'_1}{x_1}; \quad M_2 = \frac{x'_2}{x_2},$$

and the entire projection is:

$$M_g = M_1 M_2$$

Finally, it is necessary to determine the diameter for every other mirror segment 102.3. For this purpose the radius r is defined at the central point 170.3 of the second mirror segment 102.3. The central point 170.3 of the second mirror segment 102.3 was defined in FIG. 3. The radius r is the radial distance of the central point 170.3 from the optical axis HA.

The distances $x_2$, $x'_2$ and r lead to the distances between source point of the projection (in this case the virtual focus 172 and central point 170.3), which is designated with $s_2$, and between the central point 170.3 and the image point (in this case the focus of the $1^{st}$ order 127 in the diaphragm plane 125), which is designated as $s_{2'}$. The following applies:

$$s_2 = \sqrt{x_2^2 + r^2}; \quad s_{2'} = \sqrt{x_2'^2 + r^2}$$

$s_2$ and $s_2'$ thus designate the non-projected distances.

The grating line density n is thus obtained from the demand that the $0^{th}$ diffraction order is separated with sufficient distance g from the $1^{st}$ order in the diaphragm plane 125. The distance g for the central rays 174.1 of the partial beam bundles diffracted into the $1^{st}$ order and 174.0 of the partial beam bundles diffracted into the $0^{th}$ order are shown in FIG. 4.

Based on the source size and by taking the lateral magnification into account, the size of the image of the light source in the focus 127 of the $1^{st}$ diffraction order is obtained in the region of the diaphragm plane 125. It is now necessary to demand that the $0^{th}$ diffraction order has a distance therefrom, with the distance being a multiple of the image size. It can be assumed for example that in the case of a distance f of ten times a sufficient separation of the useful wavelength from the other radiation is achieved:

$$g = f \cdot d''$$

d" designates the diameter of the image of the light source 105 in the diaphragm plane 125. The diameter D of the light source 105 is stated as in table 1.

It is now possible, from this condition for the separation of the $0^{th}$ and $1^{st}$ diffraction order, i.e. the distance g, to determine the required diffraction angles $\alpha$ and $\beta$ relative to the surface normal 180 in the central point 170.3 of the second segment and the tilting $\gamma$ of the surface normal 180 in the central point 170.3 relative to the y-axis. For this purpose, the angle $\delta$ between the central rays 174.1, 174.0 between $0^{th}$ and $1^{st}$ diffraction order is calculated, which is correlated as follows with the required distance g in the diaphragm plane 125:

$$\delta = \arctan \frac{r}{x_2'} - \arctan \frac{(r-g)}{x_2'}$$

Moreover, the angles $\alpha'$, $\beta'$ of the incident and emergent partial beam bundles of the $1^{st}$ order relative to the y-axis are obtained:

$$\alpha' = \arctan \frac{x_2}{r}; \quad \beta' = \arctan \frac{x_2'}{r}$$

Now it is possible to determine the desired angles:

$$\alpha = (\alpha' - \beta' - \delta)/2$$

$$\gamma = \alpha - \alpha'$$

$$\beta = \beta' - \gamma$$

By using the diffraction formula:

$$\sin \alpha + \sin \beta = n \cdot k \cdot \lambda$$

it is now possible to calculate the line number density n for the used wavelength for the $+1^{st}$ diffraction order with k=1. The blaze angle is obtained in respect of:

$$\epsilon = (|\alpha| - |\beta|)/2$$

The radius RM of the second mirror segment in the meridian section, i.e. the curvature of the surface which is rotationally symmetrical about the optical axis HA, is determined via the focus condition for toroidal gratings. The focus condition demands $F_{20}=0$. This condition can be taken from the Handbook on Synchrotron Radiation, Vol. 2, Chapter 4 "Diffraction grating optics", edited by G. V. Marr, Elsevier Science on page 69.

From the condition $F_{20}=0$ the following follows for the radius RM of the toroidal surface in the meridian section:

$$R_M = \frac{\cos \alpha + \cos \beta}{\cos^2 \alpha / s_2 + \cos^2 \beta / s_2'}$$

Figure 4B:
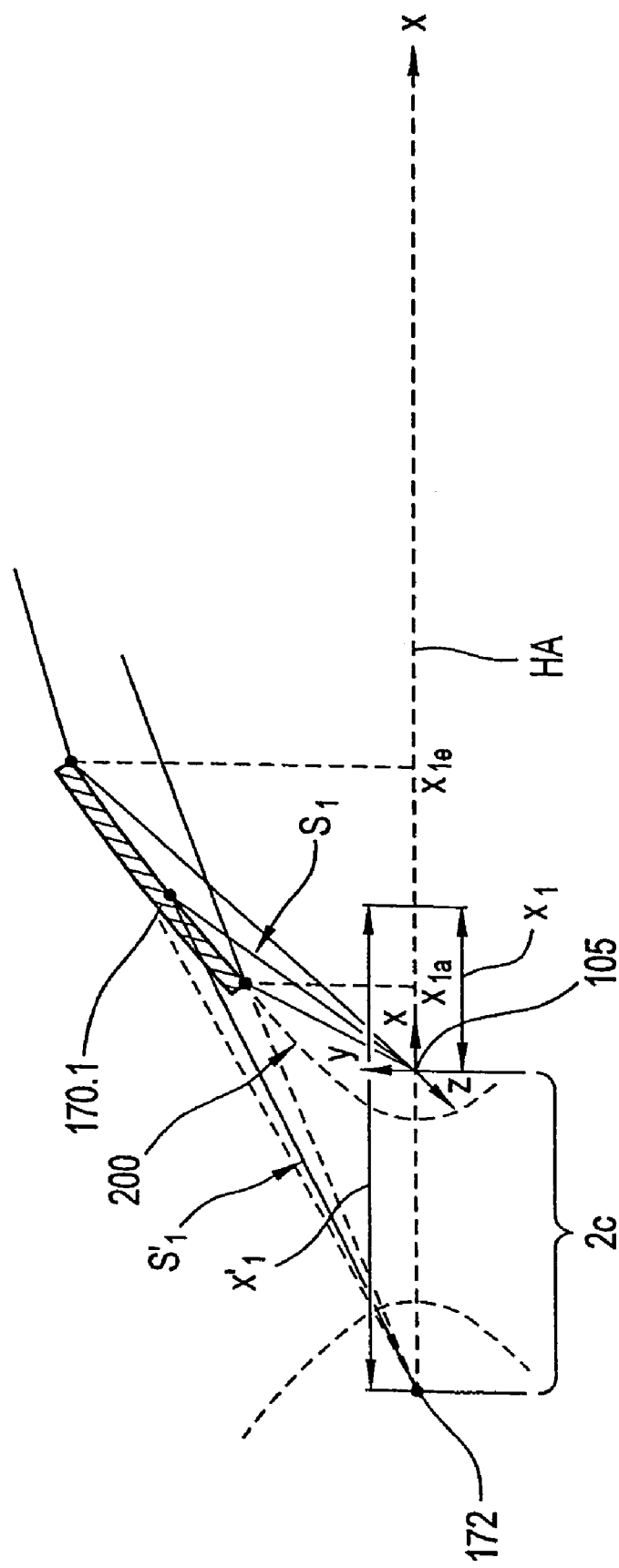
FIG. 4b shows the first segment of the shell surface as shown in FIG. 3 for deriving the radius or curvature of the hyperboloid surface in the meridian section.

Once the characteristic variables were calculated for the second mirror segment which carries the grating, the characteristic variables for the first mirror segment 170.1 with a hyperbola-shaped surface 200 in the meridian section are to be calculated. Reference is hereby made to FIG. 4b concerning the designations. The general equation for a hyperbola in the meridian section, i.e. in the x-y-plane as shown in FIG. 4b with the one vertex at the coordinate origin, is the following:

$$\frac{(x+c)^2}{a^2} - \frac{y^2}{b^2} = 1$$

The hyperbolic surface is obtained on the one hand from the condition that the source point and the virtual focus 172 of the light source is equal to the focal points of the hyperbola. This is the case when the distance between the focal points of the hyperbola corresponds precisely to 2c. On the other hand, it applies to each point of the hyperbola that the difference of the distances to the focal points is precisely 2a. Finally, the following interrelationship applies to the hyperbola:

$$b = \sqrt{c^2 - a^2}$$

The constants of the hyperbola can thus be determined. At first one calculates $2c = x_1 + x'_1$. One now starts from the border point of the grating surface to which the hyperbola shall be adjacent, thus also leading to a and thus also b.

Concerning the principles of diffractions on gratings, reference is hereby made to Handbook on Synchrotron Radiation, Vol. 2, Chapter 4, "Diffraction grating optics", edited by G. V. Marr, Elsevier Science.

Table 2 shows a 6-shell, nested collector according to the invention which is rotationally symmetrical about the main axis HA. Each shell comprises a first and second segment with a first and second optical surface which corresponds in this case with the segments. The first segment is a hyperboloid-shaped surface and a periodic grating structure is applied to the second segment.

The variables used in table 2 have all been defined previously. The chosen reference coordinate system lies with its origin (0,0,0) at the place of light source 105.

The reference numerals designate the following:

$x_1$: The distance in the direction of the x-axis from the light source 105 to the central point 170.1 of the first mirror segment $x_{1'}$: The distance in the direction of the x-axis from the virtual focus 172 to the central point 170.1 of the first mirror segment $x_2$: The distance in the direction of the x-axis from the virtual focus 172 to the central point 170.3 of the second mirror segment $x_{2'}$: The distance in the direction of the x-axis from the focal point 127 of the $_1$st order to the central point of the second mirror segment $x_g$: $x_1$: The distance in the direction of the x-axis from the light source 105 to the focal point 127 of the $1^{st}$ diffraction order $M_1$: First lateral magnification $M_2$: Second lateral magnification $M_g$: Lateral magnification of the entire projection $x_{1a}$: x-coordinate of the start of the first segment $x_{1e}$: x-coordinate of the end of the first segment $y_{1a}$: y-coordinate of the start of the first segment $y_{1e}$: x-coordinate of the end of the first segment a,b: Parameters of the hyperbola
$x_{2a}$: x-coordinate of the start of the second segment
$x_{2e}$: x-coordinate of the end of the second segment
$y_{2a}$: y-coordinate of the start of the second segment
$y_{2e}$: x-coordinate of the end of the second segment
RM: Radius of the second segment in the meridian plane
n: Line number density of the grating
α: Angle of the incident central ray relative to the normal in the central point of the second mirror shell
β: Angle of the central ray diffracted into the $1^{st}$ order relative to the normal in the central point of the second mirror shell
ε: Blaze angle
$\lambda_{min}$: Minimal wavelength passing through the diaphragm
$\lambda_{max}$: Maximum wavelength passing through the diaphragm belonging to blaze angle ε under the diffraction angle β relative to the grating normal 208 into the $+1^{st}$ diffraction order in the direction towards the diaphragm plane which is not shown here.

Figure 6:
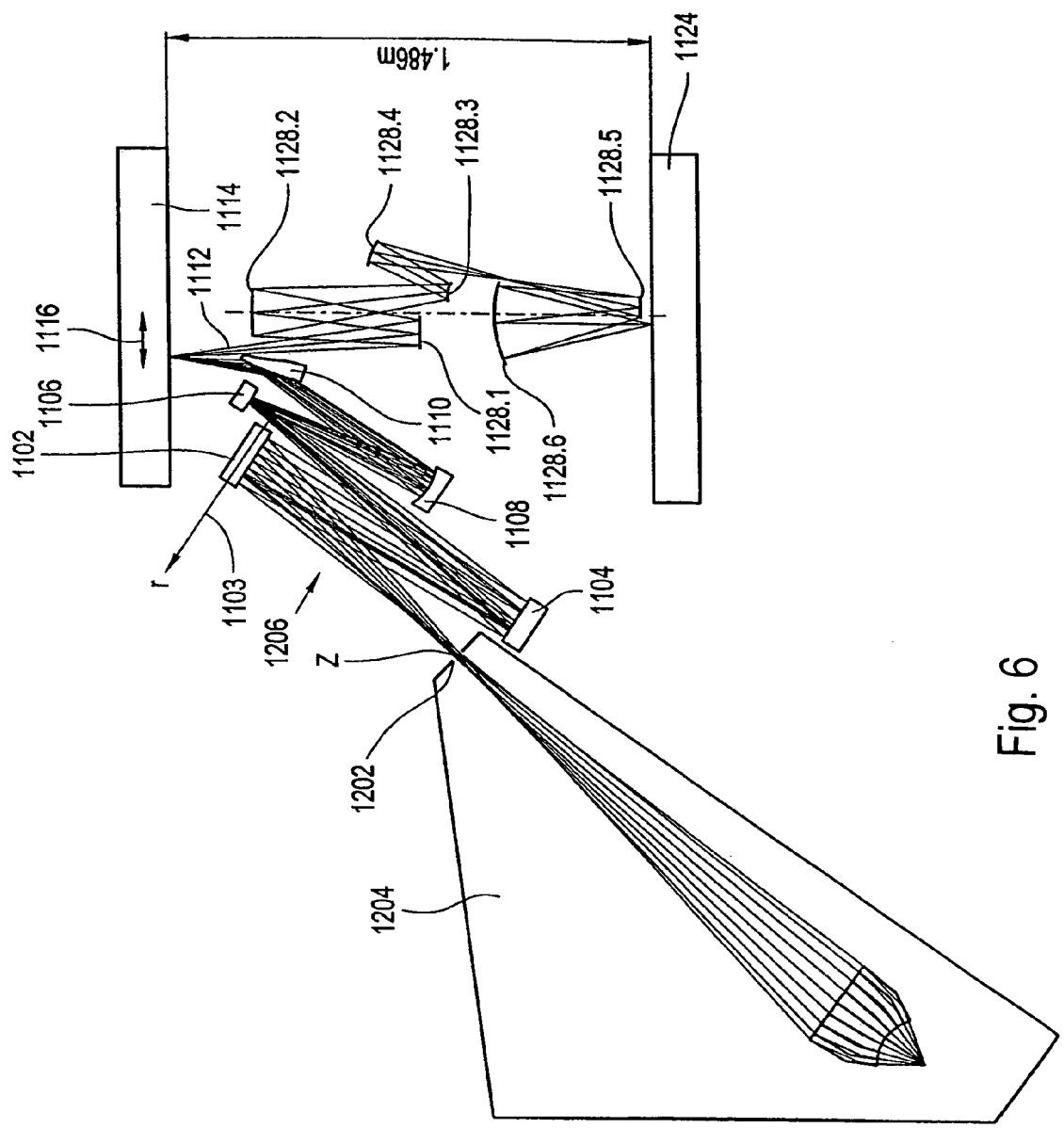
FIG. 6 shows an EUV projection exposure system with a nested collector in accordance with the invention.

FIG. 6 shows the optical components and the progress of the rays of a number of light beams of a projection exposure system with a nested collector according to the invention.

The collector in accordance with the invention comprises on the second segment a periodic grating structure. In combination with the diaphragm 1202 which is arranged in the vicinity of the intermediate image Z of the source in the $+1^{st}$ diffraction order it is possible to prevent undesirable wavelengths from entering the part of the illumination system situated behind the diaphragm 1202.

The diaphragm 1202 can also be used to separate with respect to space and pressure the space 1204 comprising the

TABLE 2

6-shell nested collector with grating structure

| | | 1st shell | 2nd shell | 3rd shell | 4th shell | 5th shell | 6th shell | Meas. |
|---|---|---|---|---|---|---|---|---|
| General | $x_1$ | 100.114892 | 140.162863 | 160.218694 | 180.2793 | 190.370309 | 210.470452 | mm |
| | $x'_1$ | −300 | −300 | −300 | −300 | −300 | −300 | mm |
| | $x_2$ | 700 | 725 | 750 | 765 | 775 | 785 | mm |
| | $x'_2$ | 1600 | 1575 | 1550 | 1535 | 1525 | 1515 | mm |
| | $x_g$ | 2100.11489 | 2140.16286 | 2160.21869 | 2180.2793 | 2190.37031 | 2210.47045 | mm |
| | $M_l$ | 2.9965572 | 2.14036724 | 1.87244067 | 1.6608456 | 1.575876 | 1.42537823 | |
| | $M_s$ | 2.28571429 | 2.17241379 | 2.06666667 | 2.00653595 | 1.96774194 | 1.92993631 | |
| | $M_g$ | 6.8492736 | 4.64976332 | 3.86971073 | 3.33904549 | 3.10091729 | 2.75088919 | |
| Hyperbola | $x_{1a}$ | 100 | 110 | 140 | 150 | 160 | 160 | mm |
| | $y_{1a}$ | 21.0405187 | 35.9120412 | 59.9620182 | 81.2450696 | 109.683484 | 138.673888 | mm |
| | $x_{1e}$ | 200.114892 | 250.162863 | 300.218694 | 330.2793 | 350.370309 | 370.470452 | mm |
| | $y_{1e}$ | 33.2205342 | 62.4494492 | 101.899121 | 141.314549 | 190.37592 | 249.594333 | mm |
| | a | 149.181725 | 147.928003 | 145.883216 | 143.342957 | 139.455046 | 134.358078 | mm |
| | b | 15.6464966 | 24.8456391 | 34.9011081 | 44.1904583 | 55.2475347 | 66.6926302 | mm |
| Grating | $x_{2a}$ | 200.114892 | 250.162863 | 300.218694 | 330.2793 | 350.370309 | 370.470452 | mm |
| | $y_{2a}$ | 33.2205342 | 62.4494492 | 101.899121 | 141.314549 | 190.37592 | 249.594333 | mm |
| | $x_{2e}$ | 599.885108 | 599.837137 | 599.781306 | 599.7207 | 599.629691 | 599.529548 | mm |
| | $y_{2a}$ | 46.7781676 | 77.5482083 | 118.096942 | 158.67946 | 209.614574 | 270.391474 | mm |
| | RM | 27990.9783 | 16117.4175 | 10275.4222 | 7603.2049 | 5794.20955 | 4589.54812 | mm |
| | N | 108.512273 | 179.3455962 | 265.913757 | 348.65787 | 448.752461 | 558.371904 | l/mm |
| | ε | 1.02297802 | 0.98703035 | 0.95203537 | 0.92996608 | 0.91198563 | 0.89069416 | deg. |
| | α | −88.671686 | −86.9571724 | −84.750416 | −82.5924967 | −79.941059 | −76.8589582 | deg. |
| | β | 86.6257299 | 84.9831117 | 82.8463457 | 80.7325645 | 78.1170877 | 75.0775699 | deg. |
| | $\lambda_{min}$ | 1.1851E−05 | 1.1983E−05 | 1.2016E−05 | 1.2024E−05 | 1.2032E−05 | 1.203E−05 | mm |
| | $\lambda_{max}$ | 15239E−05 | 1.5073E−05 | 1.5022E−05 | 1.5008E−05 | 1.498E−05 | 1.4887E−05 | mm |

Figure 5:
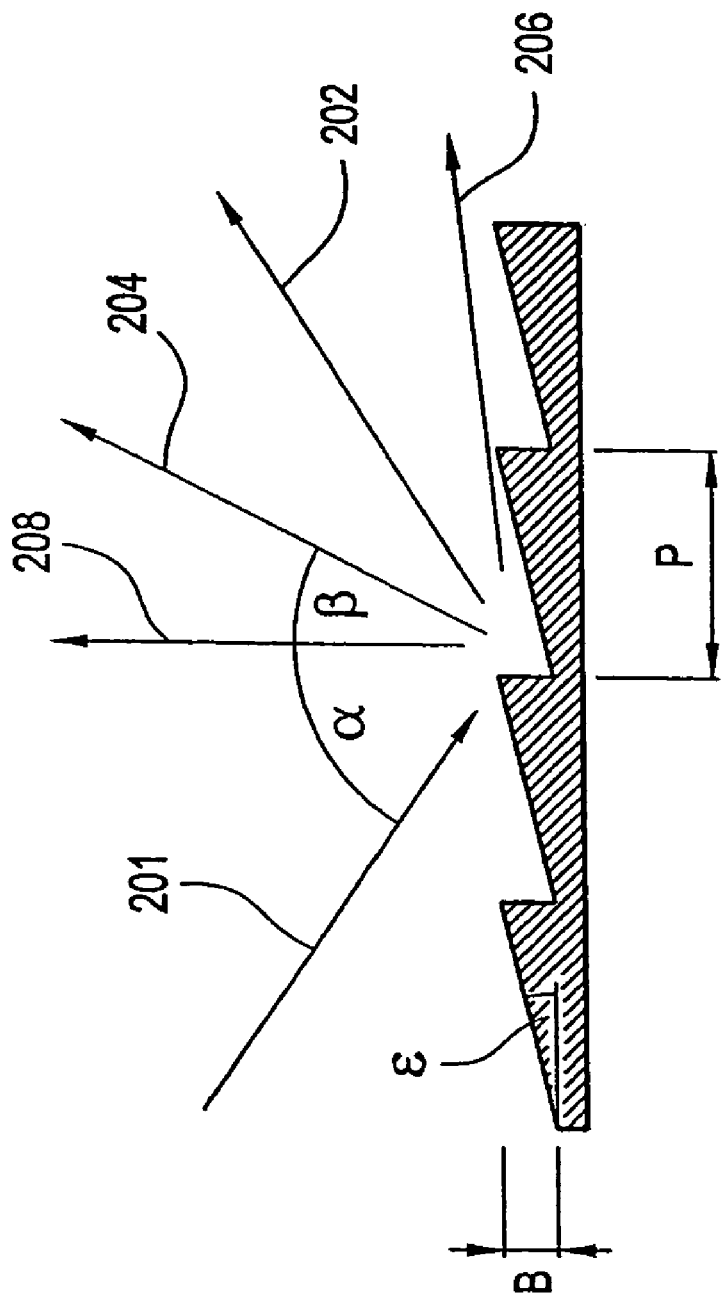
FIG. 5 shows a section of a blaze grating.

FIG. 5 shows a blaze grating with an approximately triangular groove structure. The reference numeral 201 designates the ray impinging upon the blaze grating with the grating period P. 202 designates the ray reflected on the grating into the $0^{th}$ order and 204 the ray diffracted into the $+1^{st}$ order. 208 designates the grating normal, α the angle of the incident ray relative to the normal 208 and β the angle of the ray diffracted into the $+1^{st}$ order. The following equation is obtained for the blaze angle on the basis of the variables as stated above:

$$g = \frac{|\alpha| - |\beta|}{2},$$

The blaze depth B is obtained as a predetermined blaze angle ε and line number density n as follows:

$$B = n \tan \epsilon,$$

with the ray 201 impinging with the angle α relative to the grating normal 208 being diffracted with the blaze efficiency light source 1000 and the nested collector 1003 from the subsequent illumination system 1206. The separation with respect to space and pressure allows preventing any impurities coming from the light source to reach the illumination system situated behind the diaphragm 1202.

The illumination system as shown in FIG. 6 comprises a nested collector 1003 according to the invention. The first optical element 1102 comprises 122 first raster elements with an extension each of 54 mm×2.75 mm. The second optical element 1104 comprises 122 second raster elements which are assigned to the first raster elements and which each have a diameter of 10 mm.

The optical elements 1106, 1108 and 1110 are substantially used for shaping the field in the object plane 1114. The reticle in the object plane is a reflection mask. The reticle can be displaced in the shown direction 1116 in the EUV projection system which is configured as a scanning system. The exit pupil of the illumination system is illuminated in a substantially homogeneous way. The exit pupil coincides with the entrance pupil of a downstream projection objective. The entrance pupil of the projection objective is not shown. It is situated at the position of the point of intersection of the principal ray reflected by the reticle with the optical axis of the projection objective.

A projection objective 1126 with six mirrors 1128.1, 1128.2, 1128.3, 1128.4, 1128.5, 1128.6 according to U.S. patent application Ser. No. 09/503,640 projects the reticle onto the object 1124 to be exposed.

The invention claimed is:

1. A collector unit for illumination systems with a wavelength of $\leq 193$ nm, on which rays of a beam bundle impinge, which beam bundle emerges from an object in an object plane, comprising:
    at least one mirror shell that receives the rays of the beam bundle emerging from the object and shows an optical effect; and
    a periodic structure with at least one grating period applied to at least a part of the mirror shell.

2. The collector unit according to claim 1, wherein the rays of the beam bundle impinge under an angle of $\leq 20°$ relative to a surface tangent of the mirror shell.

3. The collector unit according to claim 1, wherein the mirror shells are arranged in a rotationally symmetrical manner to a rotational axis.

4. The collector unit according to claim 3, wherein a plurality of the rotationally symmetrical mirror shells are arranged within each other around a common rotational axis.

5. The collector unit according to claim 4, further comprising a plurality of ring aperture elements of an aperture on the object side which receives light emitted by a light source arranged in the object plane, wherein each mirror shell of the plurality of the rotationally symmetrical mirror shells is associated with a ring aperture element, and wherein the ring aperture elements do not overlap.

6. The collector unit according to claim 1, wherein the mirror shells are annular segments of aspheres.

7. The collector unit according to claim 6, wherein the mirror shell is an annular segment of shape selected from the group consisting of an ellipsoid, a paraboloid, and a hyperboloid.

8. The collector unit according to one of the claim 1, further comprising a first segment of the at least one mirror shell with a first optical surface and a second segment of the at least one mirror shell with a second optical surface.

9. The collector unit according to claim 8, wherein the periodic structure is applied to the second segment.

10. The collector unit according to claim 8, wherein the period structure is applied to a segment selected from the group consisting of the first segment, and the first and second segments.

11. The collector unit according to claim 8, wherein the first segment is a first annular segment that is a section of a hyperboloid.

12. The collector unit according to claim 1, wherein the periodic structure is a blaze grating with a blaze angle $\epsilon$.

13. The collector unit according to claim 1, wherein the mirror shells have an extension in a direction of a rotational axis differs and the extension is chosen in such a way $0^{th}$ order which is diffracted on a grating is absorbed by a rear side of an adjacent mirror shell, so that no light of the $0^{th}$ order emerges from the collector unit.

14. An illumination system for wavelengths of $\leq 193$ nm, comprising:
    a light source;
    at least one collector unit; and
    a plane to be illuminated,
    wherein the collector unit is a collector unit according to claim 1.

15. The illumination system according to claim 14, further comprising a plane, between the collector unit and the plane to be illuminated, that is conjugated to the light source in which an intermediate image of the light source is formed.

16. The illumination system according to claim 14, further comprising a diaphragm arranged in or close to the intermediate image.

17. An EUV projection exposure system comprising:
    an illumination system according to claim 13;
    a mask which is illuminated by the illumination system; and
    a projective objective for projecting the mask onto a light-sensitive object.

18. The collector unit according to claim 1, wherein the wavelength is $\leq 126$ nm.

19. The collector unit according to claim 18, wherein the wavelength is in the region of EUV wavelengths.

* * * * *